United States Patent [19]

Kondoh et al.

[11] Patent Number: 4,990,915
[45] Date of Patent: Feb. 5, 1991

[54] SIGNAL PROCESSING DEVICE SUCH AS A DIGITAL FILTER UTILIZING REDUNDANT BINARY EXPRESSION AND OPERATING METHOD THEREFOR

[75] Inventors: Harufusa Kondoh; Hiromi Shimada, both of Hyogo, Japan

[73] Assignee: Mitsubishi Denki Kabushiki Kaisha, Tokyo, Japan

[21] Appl. No.: 435,859

[22] Filed: Nov. 14, 1989

[30] Foreign Application Priority Data

Dec. 2, 1988 [JP] Japan .................................. 63-306532

[51] Int. Cl.$^5$ ............................................. H03M 1/66
[52] U.S. Cl. ..................................... 341/144; 341/110; 341/136
[58] Field of Search ................. 341/136, 144, 110, 138

[56] References Cited

U.S. PATENT DOCUMENTS

| | | | |
|---|---|---|---|
| 3,832,707 | 8/1974 | Buchanan et al. | 341/117 |
| 4,045,793 | 8/1977 | Moench | 341/136 |
| 4,568,912 | 2/1986 | Kitamura et al. | 341/122 |
| 4,638,241 | 1/1987 | Colles | 323/312 |
| 4,692,738 | 7/1987 | Suzuki | 341/110 |

FOREIGN PATENT DOCUMENTS 59-186417 10/1984 Japan .
61-292422 12/1986 Japan .

OTHER PUBLICATIONS

M. Morris Mano, "Digital Logic and Computer Design", pp. 38–42, 1979, A. Avizienis, Signed-Digit Number Representations for FAST Parallel Arithmetic, IRE Transactions on Electronic Computers, pp. 389–400, 1961.

Bower et al., "VLSI Systems Design for Digital Signal Processing", Prentice-Hall, N.J., vol. 1, pp. 80–88.

Takagi et al., "A VLSI-Oriented High-Speed Multiplier Using a Redundant Binary Addition Tree", Journal of the Inst. of Electronics and Communication Engineers, vol. J66-D, No. 6, 1983.

Edamatsu et al., "A 33 MFLOPS Floating Point Processor Using Redundant Binary Representation", IEEE International Solid State Circuit Conference, Digest of Technical Papers, pp. 152, 153, 342 (1988).

*Primary Examiner*—William M. Shoop, Jr.
*Assistant Examiner*—Nancy Le
*Attorney, Agent, or Firm*—Lowe, Price, LeBlanc, Becker & Shur

[57] ABSTRACT

A D/A converter utilizing a redundant binary expression includes a current supplying circuit and a current decreasing circuit operating responsive to each bit in the signal expressed in the redundant binary expression. The current supply circuit and the current decreasing circuit have their outputs connected together while their current driving capacities are established in response to the functions of the powers of 2 for each bit. In this manner, this D/A converter is able to convert the data signals expressed in the binary redundant expression directly into analog signals.

15 Claims, 9 Drawing Sheets

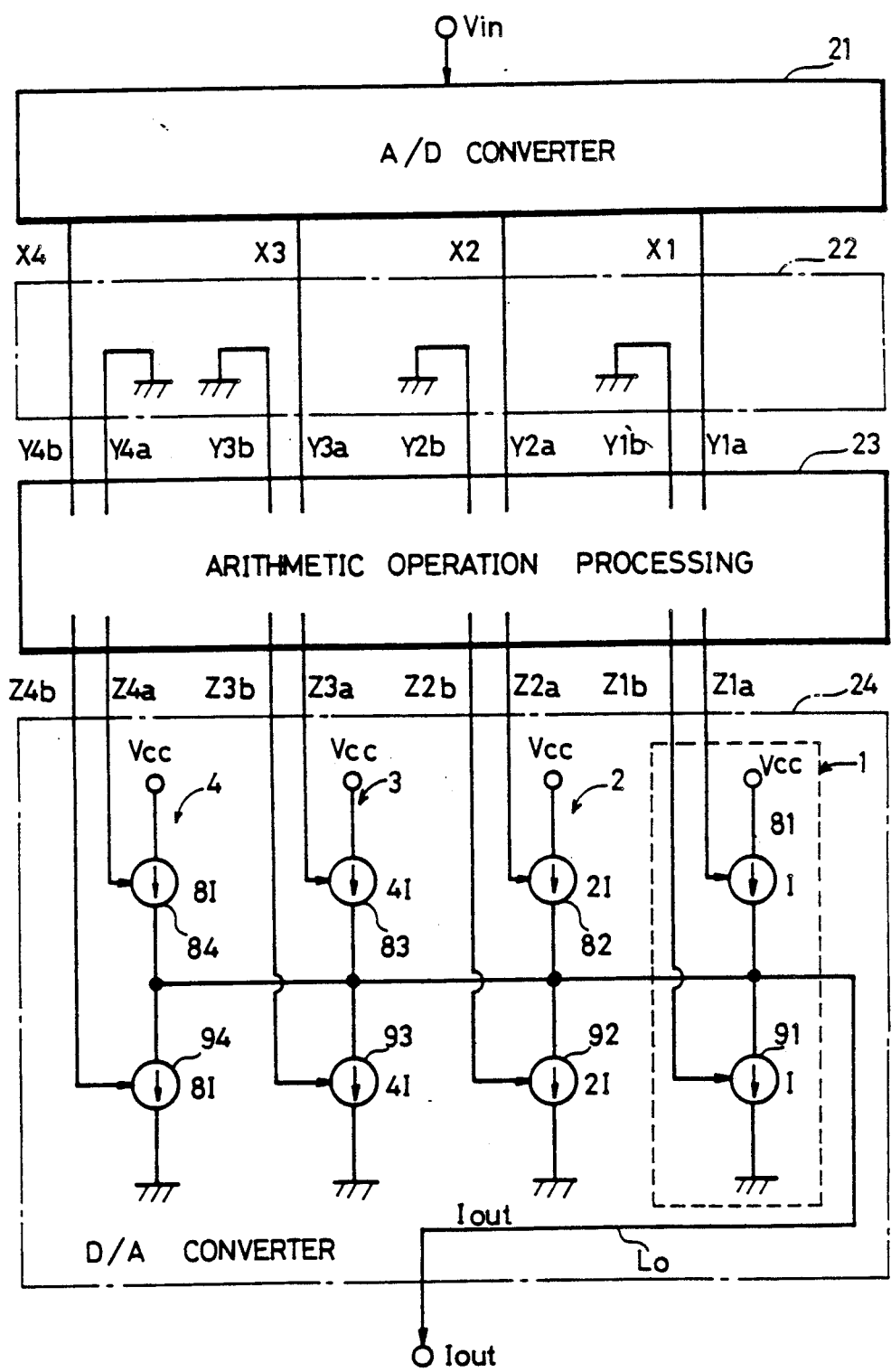

FIG.2A
| LOGIC | Zb | Za |
|---|---|---|
| 0 | 0 | 0 |
| 1 | 0 | 1 |
| -1 | 1 | 0 |
| INHIBITED | 1 | 1 |
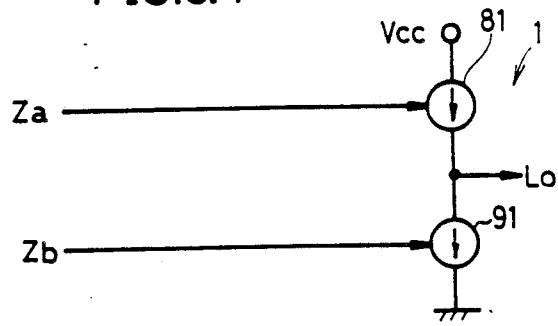
FIG.3A
FIG.2B
| LOGIC | Zb | Za | Zb·$\overline{Za}$ | $\overline{Zb}$·Za |
|---|---|---|---|---|
| 0 | 0 | 0 | 0 | 0 |
| 1 | 0 | 1 | 0 | 1 |
| -1 | 1 | 0 | 1 | 0 |
| 0 | 1 | 1 | 0 | 0 |
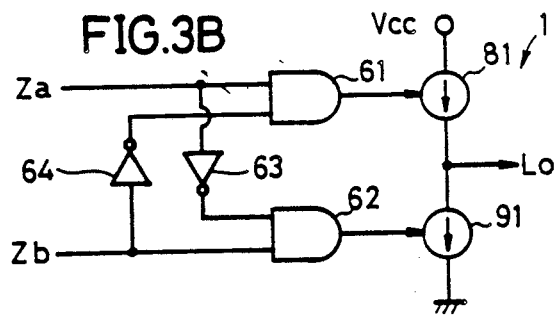
FIG.3B
FIG.2C
| LOGIC | Zb | Za | Zb·Za | $\overline{Zb}$·Za |
|---|---|---|---|---|
| 0 | 0 | 0 | 0 | 0 |
| 1 | 0 | 1 | 0 | 1 |
| INHIBITED | 1 | 0 | 0 | 0 |
| -1 | 1 | 1 | 1 | 0 |
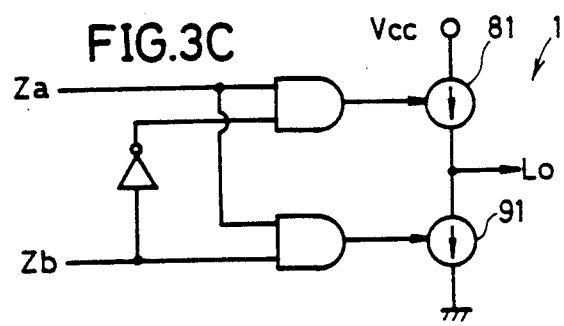
FIG.3C
FIG.2D
| LOGIC | Zb | Za | $\overline{Zb}$·Za | Zb·Za |
|---|---|---|---|---|
| INHIBITED | 0 | 0 | 0 | 0 |
| -1 | 0 | 1 | 1 | 0 |
| 0 | 1 | 0 | 0 | 0 |
| 1 | 1 | 1 | 0 | 1 |
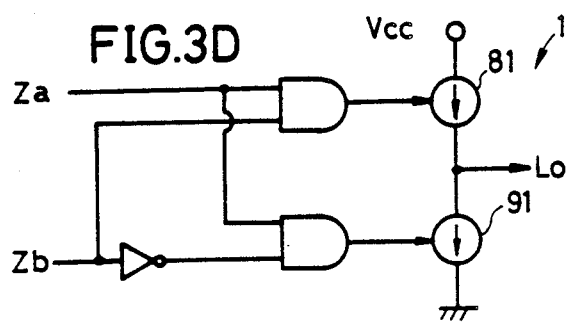
FIG.3D

FIG.4A
| EXAMPLE | Z4b | Z4a | Z3b | Z3a | Z2b | Z2a | Z1b | Z1a |
|---|---|---|---|---|---|---|---|---|
| (1) | 0 | 0 | 0 | 1 | 0 | 0 | 0 | 1 |
| (2) | 0 | 0 | 0 | 1 | 0 | 1 | 1 | 0 |
| (3) | 0 | 1 | 0 | 0 | 1 | 0 | 1 | 0 |
| (4) | 0 | 1 | 1 | 0 | 0 | 1 | 1 | 0 |
FIG.4B
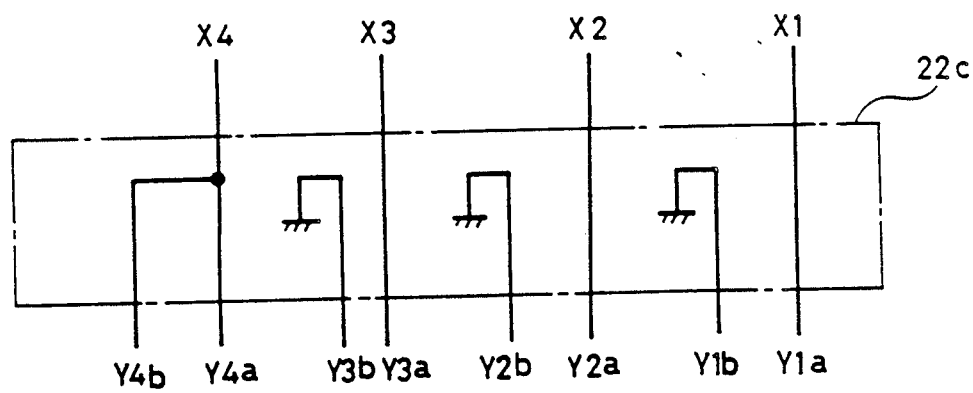
FIG.6A        FIG.6B
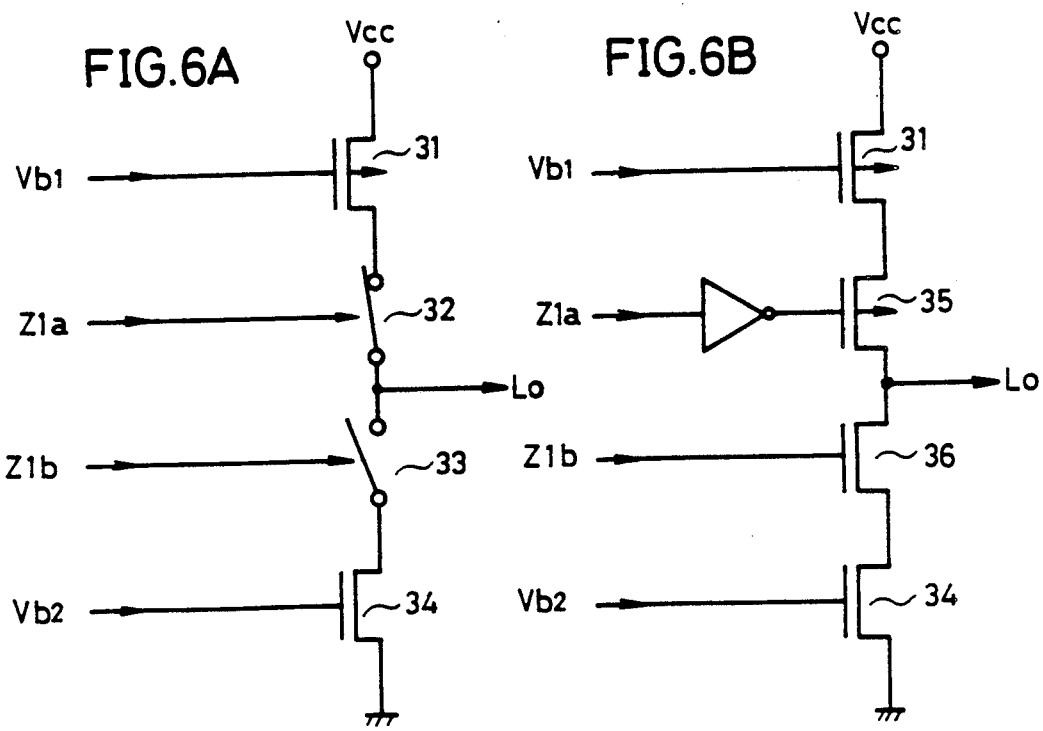

| TYPE | SUMMAND (ai) | ADDEND (bi) | 1 RANK LOWER DIGITS (ai-1, bi-1) | CARRY (ci) | INTERMEDIATE SUM (mi) |
|---|---|---|---|---|---|
| ⟨1⟩ | 1 | 1 | — | 1 | 0 |
| ⟨2⟩ | 1 | 0 | BOTH POSITIVE | 1 | -1 |
|  | 0 | 1 | AT LEAST ONE NEGATIVE | 0 | 1 |
| ⟨3⟩ | 0 | 0 | — | 0 | 0 |
| ⟨4⟩ | 1 | -1 | — | 0 | 0 |
|  | -1 | 1 |  |  |  |
| ⟨5⟩ | 0 | -1 | BOTH POSITIVE | 0 | -1 |
|  | -1 | 0 | AT LEAST ONE NEGATIVE | -1 | 1 |
| ⟨6⟩ | 1 | -1 | — | -1 | 0 |

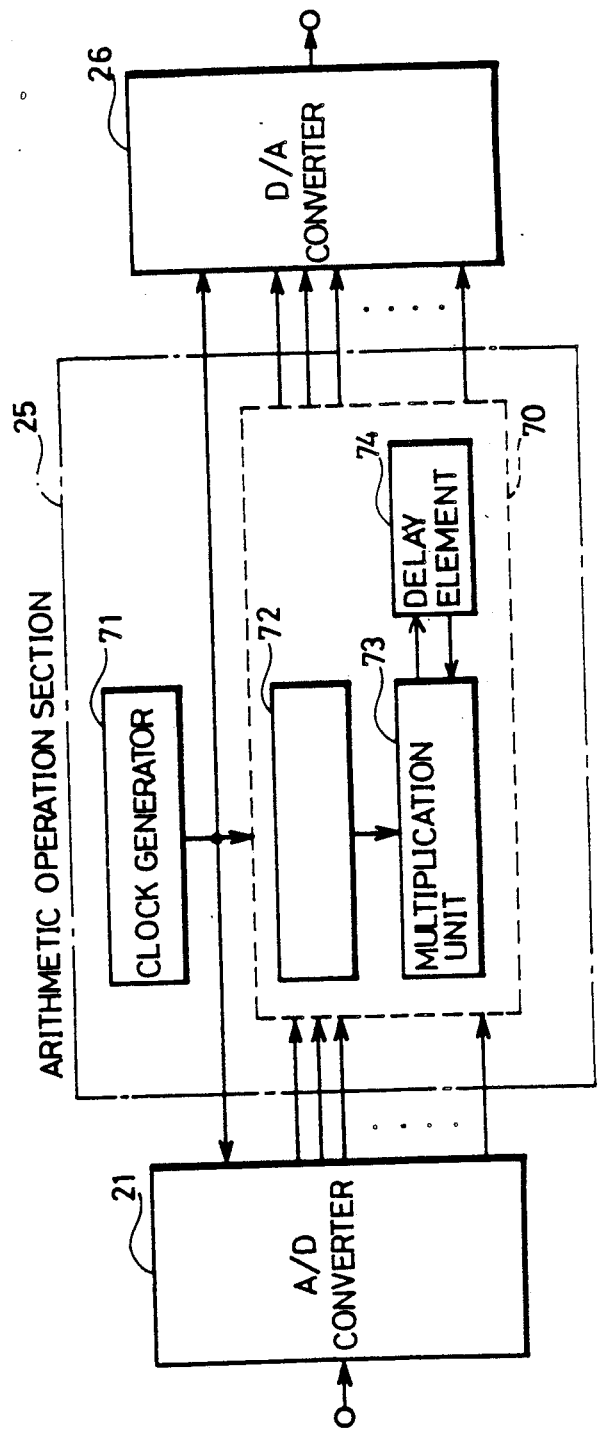

FIG.9A

ADDITION UTILIZING 2'S COMPLEMENT EXPRESSION

|     |     |   |   |   |   |   |   |   |   |         |
| --- | --- | - | - | - | - | - | - | - | - | ------- |
| Ac  | ... | 0 | 0 | 0 | 0 | 1 | 0 | 1 | 1 | ( = 11 ) |
| +) Bc | ... | 0 | 1 | 0 | 1 | 1 | 1 | 0 | 1 | ( = 93 ) |

$$1 \leftarrow 1 \leftarrow 1 \leftarrow 1 \leftarrow 1 \leftarrow 1$$

|     |     |   |   |   |   |   |   |   |   |          |
| --- | --- | - | - | - | - | - | - | - | - | -------- |
| Sc  | ... | 0 | 1 | 1 | 0 | 1 | 0 | 0 | 0 | ( = 104 ) |

← SHOWS CARRY PROPAGATION

FIG.9B

ADDITION UTILIZING REDUNDANT BINARY EXPRESSION

|     |     |   |   |   |   |   |   |   |   |         |
| --- | --- | - | - | - | - | - | - | - | - | ------- |
| Ar  | ... | 0 | 0 | 0 | 0 | 1 | 0 | 1 | 1 | ( = 11 ) |
| +) Br | ... | 0 | 1 | 0 | 1 | 1 | 1 | 0 | 1 | ( = 93 ) |

|     |     |   |    |   |    |   |    |    |   |
| --- | --- | - | -- | - | -- | - | -- | -- | - |
| M   | ... | 0 | -1 | 0 | -1 | 0 | -1 | -1 | 0 |
| C   | ... | 0 | 1  | 0 | 1  | 1 | 1  | 1  | 1 |

|     |     |   |   |    |   |   |   |   |   |          |
| --- | --- | - | - | -- | - | - | - | - | - | -------- |
| Sr  | ... | 0 | 1 | -1 | 1 | 0 | 1 | 0 | 0 | 0 ( =104 ) |

SIGNAL PROCESSING DEVICE SUCH AS A DIGITAL FILTER UTILIZING REDUNDANT BINARY EXPRESSION AND OPERATING METHOD THEREFOR

BACKGROUND OF THE INVENTION

1. Field of the Invention

This invention relates in general to a signal processing device such as a digital filter utilizing a redundant binary expression. More particularly, it relates to a signal processing device adapted for converting digital input signals expressed in a redundant binary expression into corresponding analog signals. The invention has particular applicability to a digital filter.

2. Description of the Background Art

As is well known, the complement expression of 2 is widely used for arithmetic operations in various data processing apparatuses besides digital computers. The reason for this is that by using the complement expression of 2, a subtraction can be carried out by an addition of a summand and an addend both represented in 2's complement expression. Therefore, it becomes possible to carry out all arithmetic operations by addition in principle. Further, it is noted that the conversion of data represented in binary expression into data represented in 2's complement expression is very easy, as described in detail in a textbook entitled "Digital Logic and Computer Design" by M. MORRIS MANO copyrighted in 1979 (pp. 38 to pp. 42 in Japanese version).

When a figure X expressed in 2's complement expression, that is Xn, X(n−1), ..., X1, the figure X is expressed by the following formula (1);

$$X = -Xn \cdot 2^{n-1} + \sum_{i=1}^{n-1} Xi \cdot 2^{i-1} \quad (1)$$

wherein Xi is either 1 or 0. Thus, domain of the figure X may be defined by the following formula (2).

$$-2^{n-1}+1 \leq X \leq 2^{n-1} \quad (2)$$

On the other hand, there is so far known a method of expressing data signals by redundant binary expression. A detailed description pertinent to the redundant binary expression can be found in, for example, an article of IRE September 1961 entitled "Signed-Digit Number Representations for FAST Parallel Arithmetic" by A. AVIZIENIS.

A given number Y, when expressed by the redundant binary expression Yn, Y(n−1), ..., Y1, may be defined by the following formula 3;

$$Y = \sum_{i=1}^{n} Yi \cdot 2^{i-1} \quad (3)$$

wherein Yi may assume −1, 0 or 1.

When the figure X is expressed by the 2's complement expression, there exist only one way of expression of Xn, X(n−1), ..., X1. However, when employing the redundant binary expression, a given decimal quantity 5 may be expressed in several ways, as shown by the following formulas;

$$5 = 0\ 1\ 0\ 1 = 0 \cdot 2^3 + 1 \cdot 2^2 + 0 \cdot 2^1 + 1 \cdot 2^0 \quad (4a)$$

$$5 = 0\ 1\ 1\ -1 = 0 \cdot 2^3 + 1 \cdot 2^2 + 1 \cdot 2^1 - 1 \cdot 2^0 \quad (4b)$$

$$5 = 1\ 0\ -1\ -1 = 1 \cdot 2^3 + 0 \cdot 2^2 - 1 \cdot 2^1 - 1 \cdot 2^0 \quad (4c)$$

$$5 = 1\ 0\ 31\ 1\ -1 = 1 \cdot 2^3 + 0 \cdot 2^2 - 1 \cdot 2^1 - 1 \cdot 2^0 \quad (4c)$$

$$5 = 1\ -1\ 1\ -1 = 1 \cdot 2^3 - 1 \cdot 2^2 + 1 \cdot 2^1 - 1 \cdot 2^0 \quad (4d)$$

In this manner, when the data is expressed by the redundant binary expression, a given decimal quantity may be expressed in several ways, so that there is no necessity of carry transfer when performing the operation of addition or subtraction. Thus an advantage is derived that the carry signals are no longer required and a high speed addition or subtraction can be performed. This will be more clearly understood by the description of the following example.

FIG. 9A shows an idea of an addition of two data expressed in the 2's complement expression. FIG. 9B shows an idea of an addition of two data expressed in the redundant binary expression. An addition of 11 (=A) and 93 (=B) in decimal quantity is shown as an example in these figures. Referring to FIG. 9A, the data Ac and Bc expressed in 2's complement expression are added resulting in the data Sc represented in 2's complement. As is denoted by an arrow in FIG. 9A, 5 carries are generated in the lower 6 bits.

Meanwhile, referring to FIG. 9B, the data Ar and Br each expressed in redundant binary expression are added, resulting the data Sr represented in the redundant binary expression. In this calculation, the rule in association with the carry C and an intermediate sum M shown in FIG. 9C is applied.

FIG. 9C is a table defining the relation between each of the summand ai, addend bi, summand ai-1 and an addend bi-1 of 1 digit lower rank for finding respective digits ci and mi of carry and intermediate sum. By applying the relation shown in FIG. 9C, the carry C and the intermediate sum M shown in FIG. 9B can be provided. Therefore, the result of addition of the data Ar and Br is provided by adding the carry data C and the intermediate sum data M. In this addition, carry transfer is not generated, and accordingly, the carry transfer signal becomes unnecessary. This method of calculation is described in detail in an article entitled "A VLSI-Oriented High-Speed Multiplier Using a Redundant Binary Addition Tree" (1983 Journal of Institute of Electronics and Communication Engineers Vol. J66-D No. 6).

It is noted that, when a figure expressed in the 2's complement expression is converted into a figure expressed in the redundant binary expression, it only suffices to invert the sign of the most significant bit, that is, the sign bit, of the figure expressed in the 2's complement expression. This means that the procedure of conversion can be simplified significantly.

For example, when the sign bit (Xn) is 1, the value of the given figure X is as follows.

$$X = -2^{n-1} + \sum_{i=1}^{n-1} Xi \cdot 2^{i-1}$$

By determining the sign of the sign bit of this figure, another figure Y' is as follows.

$$Y' = 2^{n-1} + \sum_{i=1}^{n-1} Xi \cdot 2^{i-1}$$

The figure Y' is equal to the figure Y' expressed by the formula (3). In this manner, a figure expressed in the redundant binary expression may be derived easily by simply inverting the sign of the sign bit.

Conversely, when converting a figure expressed in the redundant binary expression into a figure expressed in the 2's complement expression, it is necessary to perform addition or subtraction with respect to the figure expressed in the 2's complement expression, since there may be the cases wherein Yi is 1 or −1. That is, for obtaining a figure expressed in the 2's complement expression, it is necessary to perform an arithmetic operation of the following formula. 2's Complement Expression $$= \sum_{Y_i=1} Y_i \cdot 2^{i-1} - \sum_{Y_i=-1} Y_i \cdot 2^{i-1} \quad (5)$$

It is pointed out that, when performing the arithmetic operation shown by the formula (5), it is necessary to perform an addition accompanied by carry transfers.

FIG. 10 is a block diagram showing the general arrangement of a digital filter as an example of a conventional signal processing device. Referring to FIG. 8, this digital filter includes an A/D converter 21 for converting input analog signals into corresponding digital signals, an arithmetic operation section 25 for performing an arithmetic operation as a digital filter, and a D/A converter 26 for converting the digital signals from the arithmetic operation section 25 into analog signals. The arithmetic operation section 25 includes a clock generator 71, a coefficient memory 72 activated responsive to clock signals generated in the clock generator 71, a multiplication unit 73, and a delay element 74.

The arithmetic operation section 25 of the digital filter shown in FIG. 8 performs an arithmetic operation on data expressed in 2's complement expression. That is, the A/D converter 21 converts the analog signals into digital data expressed in 2's complement expression to transmit the digital data to the arithmetic operation section 25. The output data outputted from the arithmetic operation section 25 are also similarly expressed into 2's complement expression. Thus, the D/A converter 26 converts the two data from the arithmetic operation section 25 expressed in 2's complement expression into analog signals.

In the conventional arithmetic operation device for signals shown in FIG. 8, since the arithmetic operation in the operation section 25 is performed with respect to the data expressed in the 2's complement expression, it is necessary to perform carry transfers at the time of addition or subtraction, so that a high speed arithmetic operation cannot be achieved.

Even supposing that a circuit for performing the arithmetic operation on data expressed in the redundant binary expression is provided in the arithmetic operation section 25, it is necessary to convert the manner of expression of output data from the arithmetic operation section 25 from the redundant binary expression into the 2's complement expression. This means that a converting circuit for the manner of expression need be provided a new between the arithmetic operation section 25 and the D/A converter 26. As discussed hereinabove, an addition accompanied by carry transfers need be performed at the time of conversion of the data expressed by the formula (5). The result is that, even supposing that the arithmetic operation on the data expressed in the redundant binary expression is performed in the arithmetic operation section, it takes much time to convert the data of the results of the arithmetic operation into the 2's complement expression, so that the high speed arithmetic operation cannot as a whole be achieved.

A prior art having pertinence to this invention may be seen in IEEE International Solid State Circuit Conference, Digest of Technical Papers, pp. 152, 153, 342 and 343, 1988. This prior art example also discloses a high speed digital multiplier using a redundant binary expression. In this high speed digital multiplier, multiplication is carried out on data represented in the redundant binary expression, and thereafter the calculated data are converted into 2's complement expression.

SUMMARY OF THE INVENTION

It is an object of the present invention to provide a signal processing device having a high speed of signal processing.

It is another object of the present invention to provide a signal processing device in which data signal expressed in the redundant binary expression may be converted into analog signals instead of being converted into the 2's complement expression.

It is still another object of the present invention to provide a signal processing device wherein analog signals showing the results of processing by the redundant binary arithmetic operation may be obtained at a high speed.

It is yet another object of the present invention to provide a digital filter implemented using the redundant binary expression signal processing.

It is still another object of the present invention to provide increasing operation speed of a digital filter implemented using the redundant binary expression data processing.

Stated briefly, the signal processing device according to the present invention includes a plurality of current supply circuits or circuitry each provided in correspondence to each digit of a digital input signal expressed in the redundant binary expression. The output of each current supply circuitry is connected together at a common output node. The digital input signal contains a plurality of digits expressed in the redundant binary expression using first and second binary bits each represented as a logic. Each current supply circuitry includes a current increasing circuitry responsive to the first binary bit for supplying a current of a predetermined value to the common output node, a current decreasing circuitry responsive to the second binary bit for subtracting the current of the predetermined specified value from the common output node, and current setting means for setting the predetermined value of the output current of the current subtracting circuitry and the current increasing circuitry. The predetermined value is established by the current setting means so that it is increased responsive to the function of the powers of 2 for each current supply circuit.

In operation, each current supply means is responsive to the first and second binary bits of the input digital signal to increase or decrease the current at the common output node, so that the digital input signal can be converted into analog signal.

In one aspect of the present invention, the signal processing device also includes a circuit for arithmetic operation for performing a redundant binary arithmetic operation on digital signals expressed in the redundant binary expression. Each current supply circuitry is connected for receiving signals from the arithmetic operation circuit expressed in the redundant binary expression as input signals.

In operation, the arithmetic operation is performed in the arithmetic operation processing circuit such that on the data expressed in the redundant binary expression, so that high speed arithmetic operation can be achieved.

According to another aspect of the present invention, the signal processing device further includes a data supply circuitry for supplying data signals expressed in 2's complement expression and an expression converting circuitry for converting the data signal from the data supply circuit into signals expressed in the redundant binary expression. The arithmetic operation circuit is connected to the output of the signal converting circuit and is responsive to the converted signals in the redundant binary expression to perform an arithmetic operation.

In operation, the data signals expressed in the 2's complement expression are converted by the expression converting circuit into redundant binary expression and the thus converted signals are processed by the arithmetic operation processing circuit.

The digital filter in accordance with the present invention comprises, in an aspect, an arithmetic processing portion for carrying out arithmetic processing for digital filtering function by employing redundant binary expressed data processing. The arithmetic processing portion outputs digital signals containing a plurality of digits expressed in redundant binary notation. Each of the plurality of digits has first and second binary bits according to a predetermined logic system. The digital filter also comprises a plurality of pairs of first and second current controlling circuits provided corresponding to each digit of the digital output signal, and a circuit for controlling the plurality of pairs of the first and second current controlling circuits in response to the bits of each digit. The outputs of the plurality of pairs of the first and second current controlling circuits are connected together to an output node.

The method of converting digital input signals containing plural bits expressed by redundant notation having first and second binary bits corresponding to each input bit in accordance with a predetermined logic system, of the present invention comprises the steps of increasing an output current by a predetermined magnitude in response to said first binary bit; decreasing said output current by said predetermined magnitude in response to said second binary bit; and supplying a resultant output current to an output node.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing a 4-bit signal processing device according to an embodiment of the present invention.

FIGS. 2A to 2D are truth tables each showing the relation of correspondence between a bit and a logic in the redundant binary expression employed in the D/A converter shown in FIG. 1.

FIGS. 3A to 3D are circuit diagrams showing circuits required in applying the logic shown in FIGS. 2A to 2D to the current supply sources shown in FIG. 1.

FIG. 4A is a logic table for illustrating an operational example of the D/A converter shown in FIG. 1.

FIG. 4B is a schematic diagram showing another example of the data converting portion shown in FIG. 1.

FIG. 6A is a circuit diagram showing another example of the current supply circuit and the current decreasing circuit shown in FIG. 1.

FIG. 6B is a circuit diagram showing a more concrete example of the circuits shown in FIG. 6A.

FIGS. 9A and 9B show ideas of addition using 2's complement expression and redundant binary expression.

DESCRIPTION OF THE PREFERRED EMBODIMENTS

Figure 5:
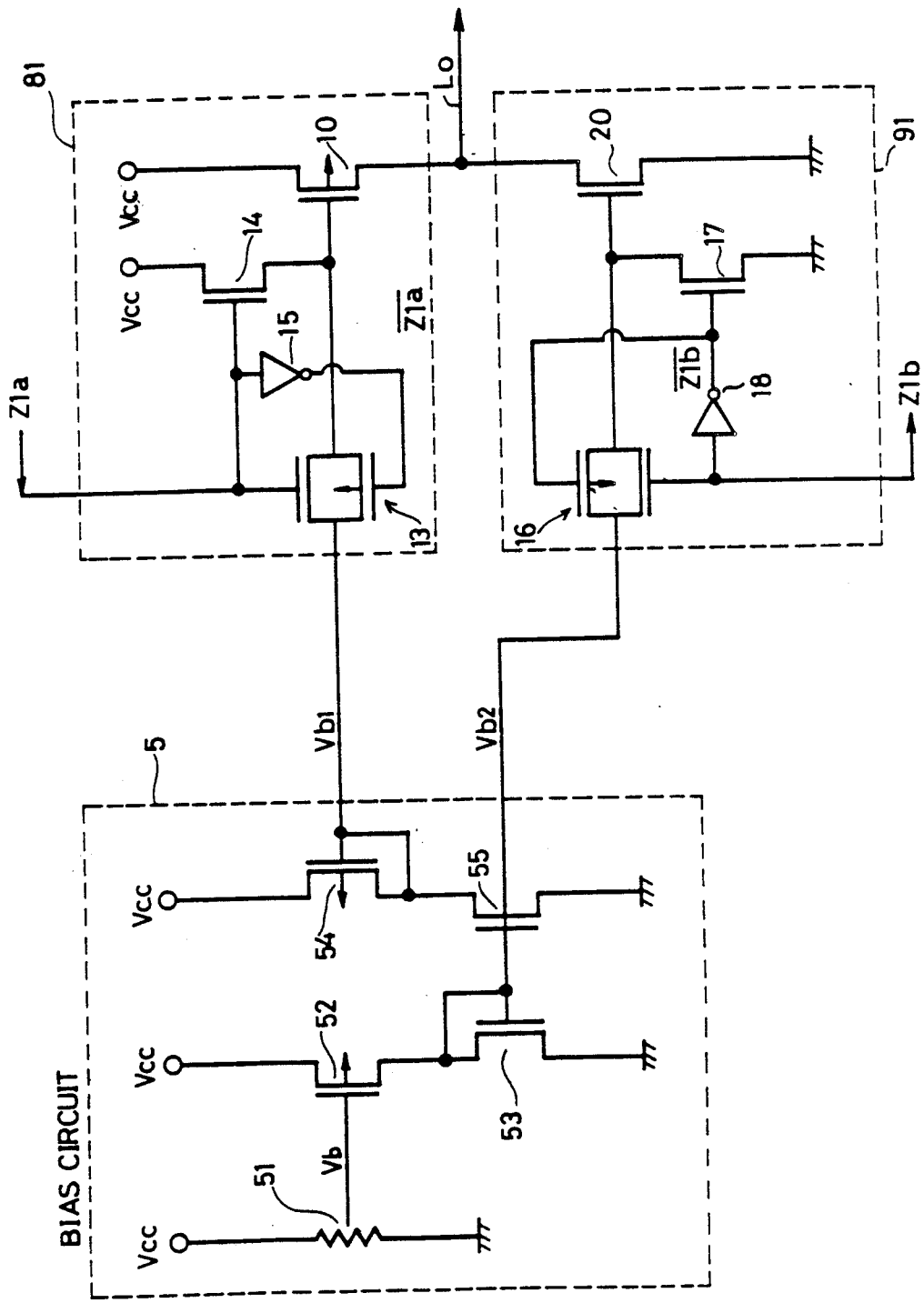
FIG. 5 is a circuit diagram showing an example of the current supply source shown in FIG. 1.

FIG. 1 is a block circuit diagram of a signal processing device or digital filter showing an example of the present invention. Referring to FIG. 1, the signal processing device includes an A/D converter 21 for converting an input analog signal Vin into digit signals X1 to X4 expressed in the 2's complement expression, a data converting section 22 for converting the digit signals X2 to X4 into bit signals Y1a to Y4b expressed in the redundant binary expression, an arithmetic operation processing section 23 for performing an arithmetic operation on the bit signals Y1a to Y4b, and a D/A converter 24 for converting bit signals Z1a to Z4b from the arithmetic operation processing section 23 expressed in the redundant binary expression into an analog signal Iout.

In the present embodiment, the D/A converter 24 receives the bit signals Z1a to Z4b expressed in the 4-digits redundant binary expression from the arithmetic operating section 23. Each one digit is constituted for example by bit pairs Z1a and Z1b. In the D/A converter 24, current supply sources 1 to 4 are provided in association with each digit. The output of the current supply sources 1 to 4 are connected together to a common output line Lo. A current signal Iout converted into an analog form is obtained via the common output line Lo.

One of the current sources, for example, the current supply source 1, includes a current supplying circuit 81 responsive to the bit signal Z1a for supplying the current to the common output line Lo, and a current decreasing circuit 91 responsive to the bit signal Z1b for decreasing the current flow in the common output line Lo. The circuit configuration of the remaining current supply sources is similar to that of the current supply source 1 described above.

The current output capacity of each of the current supply circuit and the current decreasing circuit is established at a value increasing as a function of the powers of 2. That is, with the current output capacity of each of the current supply circuit 81 and the current decreasing circuit 91 being I, the current output capacity of each of the current supply sources 2 to 4 is set to 2I, 4I and 8I.

For converting the digit signals X1 to X4 into bit signals expressed in the redundant binary expression, the data converting section 22 includes a circuit for inverting the sign of the most significant bit, that is the sign bit X4. More specifically, the data converting section 22 outputs the digit signals X1 to X3 outputted from the A/D converter 21 as each one of the bit signals Y1a to Y3a, constituting the output bits, while outputting signals at the ground potential as the other bit signal, Yib to Y3b of the output bits. As regards the most significant bit X4, the data converting section 22 outputs the ground potential signal as one of the bit signals Y4a, while directly outputting the digit signal X4 as the other bit signal Y4b. In this manner, by providing a simple connection changing circuit in the data converting section 22, data conversion can be made easily from the 2's complement expression to the redundant binary expression.

In as much as the operation is performed in the arithmetic operation processing section 23 on the data expressed in the redundant binary expression, no carry transfers are made at the time of addition or subtraction, so that high speed addition or subtraction can be performed in the processing section 23. As a result, a high speed arithmetic operation is performed in this arithmetic operation processing section 23. A circuit showing an example of the processing section 23 is disclosed in the prior art article of ISSC described above (pp. 153, FIG. 4).

FIG. 2A is a truth or logic table showing an example of the relation of correspondence between the signals supplied to the D/A converter 24 shown in FIG. 1 and the logic values in the redundant binary expression. This logic table is applied to each bit of data supplied from the arithmetic operation processing section 23 to the D/A converter 24. Since each data digit is expressed by two binary bits Za and Zb in this example, the data expressed in the redundant binary expression can be handled more easily in the D/A converter 24 than in the following.

FIGS. 2B to 2D shown logic tables showing the relation of correspondence between the bits Za and Zb and the logic in the redundant binary expression. It is possible in this manner to apply similar relations of correspondence between the logic in the redundant binary expressions and the signals Za, Zb.

FIGS. 3A to 3D are circuit diagrams showing circuits connected at the stages preceding the current supply sources 1 to 4. These circuits are necessitated for applying the relation of correspondence between the logic based on the logical tables shown in FIGS. 2A to 2D and the signals Za and Zb. For example, when the logic shown in FIG. 2A is applied, no circuit is necessitated at the stage preceding the current supply source 1, as shown in FIG. 3A. Conversely, when the logic shown in FIG. 2B is applied, a preceding circuit constituted by AND gates 61 and 62 and inverters 63 and 64 is provided, as shown in FIG. 3B. Similarly, the circuits shown in FIG. 3C and 3D are provided from the logic shown in FIG. 2B is applied. Similarly, the circuit shown in FIGS. 3C and 3D are provided when the logic shown in FIG. 2C and FIG. 2D is applied, respectively.

The operation is hereinafter explained for the case in which the logic shown in FIG. 2a is applied in the D/A converter 24 shown in FIG. 1.

Assuming that the result of the arithmetic operation in the arithmetic operating section 23 is 5, the redundant binary expressions already explained with reference to the formulas (4a) to (4d) become possible.

FIG. 4 is a logic table showing an example of the logics of each signal for the case in which a decimal quantity 5 is outputted as an example from the arithmetic operating section 23. In FIG. 4, the examples (1) to (4) correspond to the formulas (4a) to (4d).

In the example (1), the current supply circuits 81 and 83 are turned on responsive to the bit signals Z1 and Z3a, so that the currents I and 4I are supplied to the common output line Lo.

In the example 2, the current supply circuits 82 and 83 and the current decreasing circuit 91 are turned on, so that the currents 2I and 4I are supplied to the common output line Lo, at the same time that the current I is decreased from the line Lo.

Similarly, in the examples (3) and (4), the current supply sources 1 to 4 are responsive to the bit signals Z1a to Z4b to supply the currents to the common output line Lo. As a result, the converted analog output signal Iout having the sum of the current value of 5I is produced in any of the above examples.

The data converting portion 22 shown in FIG. 1 can be applied not only to the logic shown in the table of FIG. 2A but also to the logic shown in FIG. 2B. However, in order to apply the logic shown in FIG. 2C, the circuit 22c shown in FIG. 4B should be applied as the data processing portion.

FIG. 5 is a circuit diagram showing an example of the current supply source shown in FIG. 1. Although the circuit of the current supply source 1 is shown herein, the circuit configuration of the other current supply sources 2 to 4 is similar to that of the current supply source 1. Referring to FIG. 5, this current supply source 1 includes a current supply circuit 81, a current decreasing circuit 91 and a bias circuit 5 for supplying a bias voltage to the circuits 81 and 91.

The bias circuit 5 includes a series connection of a PMOS transistor 52 and a NMOS transistor 53 and a series connection of a PMOS transistor 54 and an NMOS transistor 55 connected each between a source potential Vcc and a ground potential. The transistor 52 has its gate connected to receive a bias voltage Vb. The transistor 54 has its gate connected to a connection node between transistors 54 and 55. A bias voltage Vb1 for the current supplying circuit 81 is outputted from the connection node. On the other hand, the transistor 53 has its gate connected to a connection node between transistors 52 and 53. A bias voltage Vb2 for the current decreasing circuit 91 is outputted from the connection node.

The current supplying circuit 81 includes a PMOS transistor 10 connected between the source potential Vcc and the common output line Lo, an NMOS transistor 14 connected between the source potential Vcc and the gate of transistor 10, a transmission gate 13 and an inverter 15. The transistor 10 has the gate connected to receive the bias voltage Vb1 from the bias circuit 5 via the transmission gate 13. The transistor 14 is connected so that its gate receives the signal Z1a. The transmission gate 13 has the gates connected to receive the signals Z1a and Z1a.

The current decreasing circuit 91 includes an NMOS transistor 20 connected between the common output line Lo and the ground potential, an NMOS transistor 17 connected between the gate of transistor 20 and the ground potential, a transmission gate 16 and an inverter 18. The transistor 20 has the gate connected to receive the bias voltage Vb2 via the transmission gate 16. The transistor 17 is connected so that its gate receives the signal Z1b via inverter 18. The transmission gate 16 has the gates connected to receive the signal Z1b and Z1B.

In the example of the current supply source shown in FIG. 5, the output current capacity for each of the current supplying circuit 81 and the current decreasing circuit 91 is established by the bias voltages Vb1 and Vb2 supplied from the bias circuit 5. That is, the current flowing through the transistor 10 is determined by the voltage Vb1. Similarly, the current flowing through transistor 20 is also determined by the voltage Vb2. Alternatively, it is possible to set the output current capacity selectively by controlling the size of the transistors 10 and 20.

Hence, the current supply sources 1 to 4 shown in FIG. 1 may be realized by setting by the device size of the transistor 10 and 20 responsive to the function of the powers of 2 for each bit. In the circuit shown in FIG. 5, by setting the size ratio of the transistors 54 to 10 so as to be equal to the size ratio of the transistors 55 to 20 it is possible to set the value of the current flowing through transistor 10 when transistor 10 is conductive to a value equal to the value of the current flowing through transistor 20 when the transistor 20 is conductive.

FIG. 6A is a circuit diagram showing modified examples of the current supply circuit and the current decreasing circuit shown in FIG. 1. FIG. 6B is a circuit diagram showing the circuit of FIG. 6A in more detail. The redundant binary D/A converter can be realized easily by applying the circuit shown in FIG. 6A as the current supply source for each bit in the D/A converter.

Figure 7:
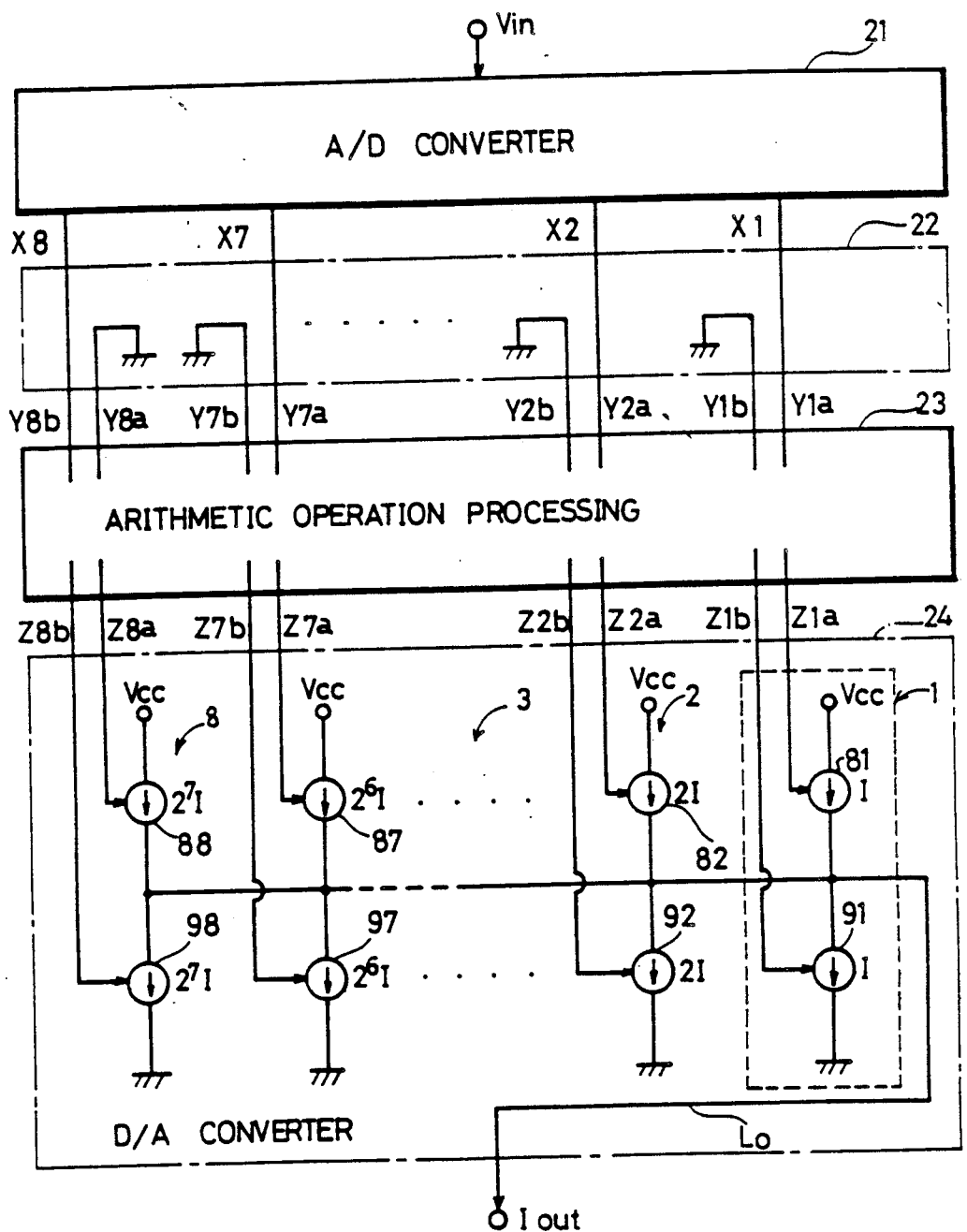
FIG. 7 is a block diagram showing an 8-bit signal processing device according to another example of the present invention.

Although the foregoing description has been made of the signal processing device handling the 4-digit data the present invention is not limited thereto but may be applied to a signal processing device handling, for example, 8-digit data. FIG. 7 shows such modification of the present invention.

The example of application of the signal processing apparatus shown in FIG. 1 will be described in the following. When a digital filter is selected as an example of a signal processing apparatus, a known circuit having the structure for the digital filter is provided in the processing section 23 shown in FIG. 1. The circuit structure for the digital filter is disclosed in, for example, a textbook entitled "VLSI SYSTEMS DESIGN FOR DIGITAL SIGNAL PROCESSING" by B. A. Bower et al (Vol. 1) pp.80 to 88, copyright 1982.

Figures 8, 9C:
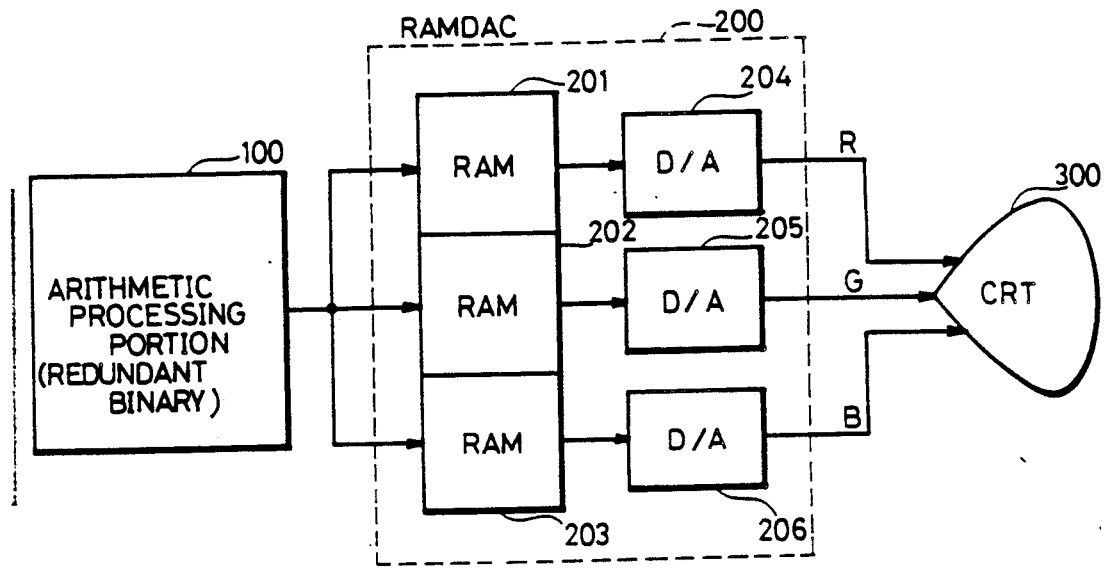
FIG. 8 is a block diagram of an image processing showing an application of the present invention.
FIG. 9C is a table showing a rule applied to the addition shown in FIG. 9B.
Figure 10:
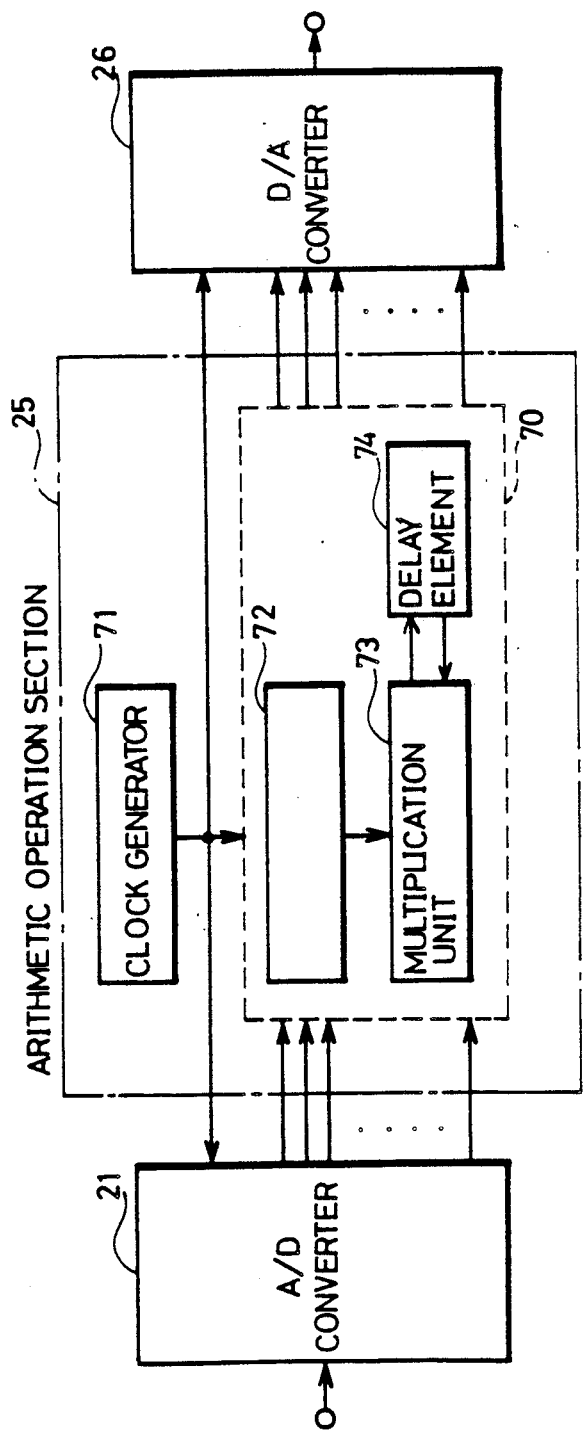
FIG. 10 is a block diagrams showing the arrangement of a conventional digital filter.

FIG. 8 is a block diagram showing an image processing system in which a random access memory digital to analog converter (hereinafter referred to as RAMDAC) is applied Referring to FIG. 8, the image processing system comprises a processing section 100 employing the redundant binary system, the RAMDAC 200 and a CRT portion 300. The RAMDAC 200 comprises RAM portions 201 to 203 for storing image data represented in the redundant binary expression for R, G and B, respectively, and A/D converters 204 to 206 for directly converting the stored data to analog signals. The D/A converter 26 shown in FIG. 1 is employed as D/A converters 204 to 206. Accordingly, an image processing system capable of high speed image processing can be provided.

The application of the present invention is not limited to the above described digital filter or the RAMDAC but it is widely applicable to signal processing apparatuses capable of redundant binary operation and in which conversion of the operated data to analogue signal is necessary.

It will be seen from the foregoing that, by employing the D/A converter 24 shown in FIG. 1, the bit signals Z1a to Z4b expressed in the redundant binary notation can be converted into analog signals without converting them from redundant binary notation into the 2's complement expression just prior to digital to analogue conversion. Thus, the data expressed in the redundant binary notation are processed in the arithmetic operating section 23 adapted to supply the bit signals Z1a to Z4b to the D/A converter 24. The result is that signal processing may be carried out more expeditiously than in the case of handling the data signals expressed in the 2's complement expression. In addition, the speed of the arithmetic operation in the signal processing device in general can be increased by applying the data converting section 22 shown in FIG. 1 for converting the data signals X1 to X4 expressed in the 2's complement expression into the redundant binary expression.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A signal processing device for converting a digital input signal containing a plurality of digits expressed by the redundant binary expression into an analog signal, wherein
    said digital input signal containing a plurality of digits is expressed in the redundant binary expression in which each digit has first and second binary bits each represented as a logic, said device comprising:
    a plurality of current supplying means each being provided in correspondence to each digit of said digital input signal and responsive to the signals of each digit to supply the current, the output of each of said current supplying means being connected together at an output node of said D/A converter, each said current supplying means including
    current increasing means connected to said output node and responsive to said first binary bit to supply a current of a predetermined value to said output node,
    current decreasing means connected to said output node and responsive to said second binary bit to subtract the current of said predetermined value from said output node, and
    current setting means connected to said current increasing means and said current decreasing means for establishing said predetermined value of the output current of said current increasing means and said current decreasing means,
    said predetermined value established by said current setting means in each of said current supplying means being set to values increasing responsive to the function of the powers of 2 for each of said current supplying means.

2. The signal processing device according to claim 1, wherein said current setting means includes
    a first control voltage generating means connected to said current increasing means for generating a first control voltage for setting said predetermined value of said output current of said current increasing means, and a second control voltage generating means connected to said current decreasing means for generating a second control voltage for setting said predetermined value of said output current of said current decreasing means, said first and second control voltage generating means being operatively connected to each other.

3. The signal processing means according to claim 2, wherein said current increasing means includes a series connection of a first switching means and a first field effect transistor between a predetermined first potential and said output node, said first field effect transistor including a control electrode, said first switching means operating in response to said first binary bit, said first field effect transistor has the control electrode connected to receive the first control voltage from said first control voltage generating means, said current decreasing means includes a series connection of a second switching means and a second field effect transistor between a predetermined second potential and said output mode, said second field effect transistor including a control electrode, said second switching means operating in response to said second binary bit, said second field effect transistor has the control electrode connected to receive the second control voltage from said second control voltage generating means.

4. The signal processing device according to claim 2 wherein said current increasing means includes a third field effect transistor connected between a predetermined third potential and said output node and a third switching means connected to said first control voltage generating means and operating in response to said first binary bit, said third field effect transistor has the control electrode connected to receive the first control voltage via said third switching means, said current decreasing means includes a fourth field effect transistor connected between a predetermined fourth potential and said output node, said fourth field effect transistor including a control electrode, and a fourth switching means connected to said second control voltage generating means and operating in response to said second binary bit, said fourth field effect transistor has the control electrode connected to receive the second control voltage via said fourth switching means.

5. The signal processing device according to claim 1, further comprising arithmetic operation processing means for supplying digital signal containing a plurality of digits expressed in the redundant binary expression by the redundant binary arithmetic operation.

6. The signal processing device according to claim 5 further comprising data supply means for supplying data signal including plural a plurality of digits expressed by 2's complement and expression converting means connected to the output of said data supply means for converting the data signal expressed by 2's complement into signal expressed in the redundant binary expression, said arithmetic operation processing means being connected to the output f said expression converting means and responsive to the converted signals in the redundant binary expression to perform an arithmetic operation.

7. The signal processing device according to claim 6, wherein data signal outputted from said data supplying means include a sign bit for indicating the sign of the data, said expression converting means including means for inverting the sign bit of the data signal from said data supplying means.

8. A signal processing device for converting a digital input signal containing a plurality of digits expressed by the redundant binary expression into a analog signal, wherein said digital input signal containing a plurality of digits is expressed in the redundant binary expression in which each digit has first and second binary bits each represented as a logic, said device comprising;

a plurality of current supplying means each being provided in correspondence to each digit of said digital input signal and responsive to the signals of each digit to supply the current, the output of each of said current supplying means being connected together at an output node.

9. A digital filter including arithmetic processing means for carrying out arithmetic processing for digital filtering function, wherein said arithmetic processing means outputs a digital signal containing a plurality of digits represented in redundant binary notation by employing data processing in redundant binary expression, each of said plurality of digits having first and second binary bits according to a predetermined logic system, said digital filter comprising:

a plurality of pairs of first and second current controlling means in correspondence with said each digit of said digital output signal;

means responsive to the bits of each digit for controlling said plurality of pairs of first and second current controlling means, outputs of said plurality of pairs of said first and second current controlling means being connected together at an output node.

10. A signal processing device for converting a digital input signal containing at least one digit expressed by a redundant binary notation into a corresponding analog signal, wherein said digital input signal contains at least one digit expressed in the redundant binary expression having first and second binary bits according to a predetermined logic system comprising:

( at least first and second current controlling means in correspondence with said at least one digit of said digital input signal; and means responsive to the bits of each digit for controlling said at least first and second current controlling means;

outputs of said current controlling means being connected together at an output node.

11. The signal processing device according to claim 10, wherein said digital input signal contains a plurality of digits expressed by said redundant binary notation, and wherein said device comprises a plurality of first and second current controlling means corresponding to said plurality of digits.

12. The signal processing device according to claim 10, wherein
   said first current controlling means comprises current increasing means connected to said output node and responsive to said first binary bit for supplying a current of a predetermined magnitude to said output node; and
   said second current controlling means comprises current decreasing means connected to said output node and responsive to said second binary bit for subtracting the current of said predetermined magnitude from said output node.

13. The signal processing device according to claim 12, wherein said device further includes
   means for establishing said predetermined magnitude as magnitudes increasing in accordance with powers of 2 for successive pairs of said current controlling means.

14. A method of converting digital input signals containing plural bits expressed by redundant notation having first and second binary bits corresponding to each input bit in accordance with a predetermined logic system, comprising the steps of:
   increasing an output current by a predetermined magnitude in response to said first binary bit;
   decreasing said output current by said predetermined magnitude in response to said second binary bit; and
   supplying a resultant output current to an output node.

15. The method of converting digital input signals according to claim 14, wherein said predetermined magnitude for successive input bits of said digital input signal being related to each other in accordance with powers of 2.

* * * * *